(12) United States Patent
Bozbey et al.

(10) Patent No.: US 11,954,581 B2
(45) Date of Patent: Apr. 9, 2024

(54) NEURON CIRCUIT

(71) Applicant: TOBB EKONOMI VE TEKNOLOJI UNIVERSITESI, Ankara (TR)

(72) Inventors: Ali Bozbey, Ankara (TR); Altay Karamuftuoglu, Ankara (TR)

( * ) Notice: Subject to any disclaimer, the term of this patent is extended or adjusted under 35 U.S.C. 154(b) by 772 days.

(21) Appl. No.: 17/254,824

(22) PCT Filed: Jun. 27, 2019

(86) PCT No.: PCT/TR2019/050510
§ 371 (c)(1),
(2) Date: Dec. 21, 2020

(87) PCT Pub. No.: WO2020/032890
PCT Pub. Date: Feb. 13, 2020

(65) Prior Publication Data
US 2021/0271961 A1    Sep. 2, 2021

(30) Foreign Application Priority Data

Jun. 28, 2018    (TR) .................................. 2018/09195

(51) Int. Cl.
*G06N 3/063* (2023.01)
*G11C 11/54* (2006.01)
*H03K 19/195* (2006.01)

(52) U.S. Cl.
CPC .............. *G06N 3/063* (2013.01); *G11C 11/54* (2013.01); *H03K 19/1952* (2013.01)

(58) Field of Classification Search
CPC ........ H10N 60/10; H10N 60/12; H10N 60/80; H10N 60/805; G06N 3/063; G06N 10/40; H03K 17/92; H03K 19/195; H03K 19/1952

See application file for complete search history.

(56) References Cited

U.S. PATENT DOCUMENTS

| | | | |
|---|---|---|---|
| 5,625,752 A | 4/1997 | Swenson | |
| 7,253,654 B2* | 8/2007 | Amin | G11C 11/44 365/162 |
| 7,268,576 B2* | 9/2007 | Amin | G06N 10/00 365/162 |
| 7,619,437 B2* | 11/2009 | Thom | G06N 10/00 257/30 |
| 7,782,077 B2* | 8/2010 | Herr | H03K 19/1952 326/4 |

(Continued)

FOREIGN PATENT DOCUMENTS

| CN | 105976022 A | 9/2016 |
|---|---|---|
| JP | H04263517 A | 9/1992 |

OTHER PUBLICATIONS

International Search Report for corresponding PCT/TR2019/050510, dated Mar. 25, 2020.

(Continued)

*Primary Examiner* — Jason M Crawford
(74) *Attorney, Agent, or Firm* — Egbert, McDaniel & Swartz, PLLC

(57) ABSTRACT

Disclosed is a neuron circuit which electronically applies the working principle of the neurons in the human brain. The neuron circuit controls an input signal according to a set threshold value, and enables provision of an output signal above the threshold value.

17 Claims, 1 Drawing Sheet

(56) References Cited

U.S. PATENT DOCUMENTS

Figure 1:
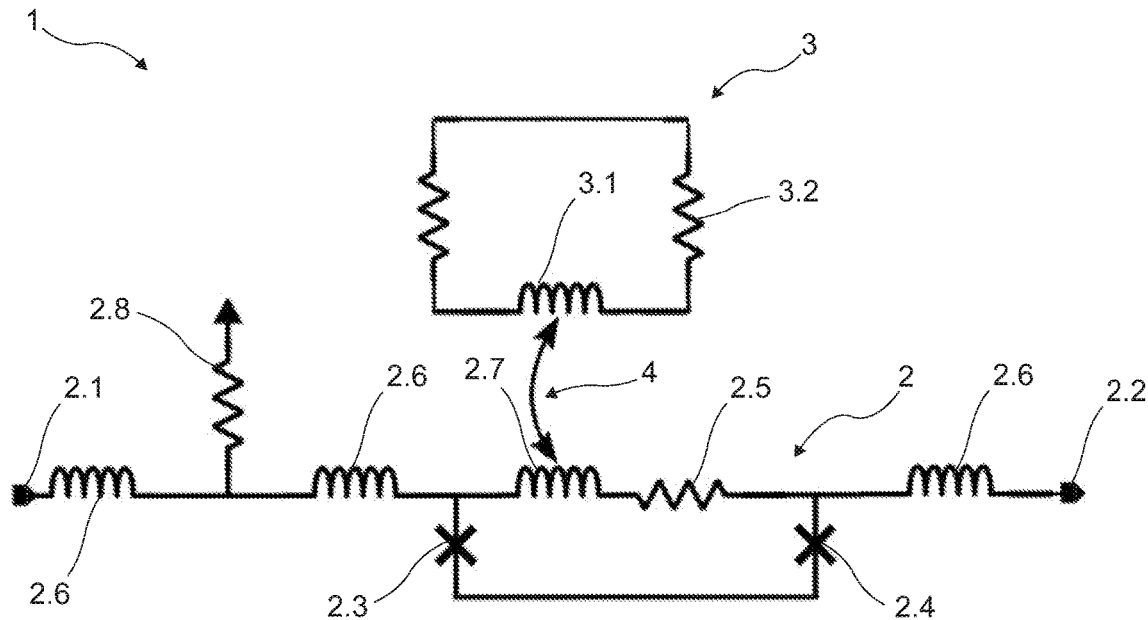

| | | | | |
|---|---|---|---|---|
| 9,509,274 | B2* | 11/2016 | Naaman | H03H 7/20 |
| 9,647,662 | B1* | 5/2017 | Abutaleb | G06N 10/00 |
| 9,928,948 | B2* | 3/2018 | Naaman | H01F 6/06 |
| 10,546,993 | B2* | 1/2020 | Ferguson | H03K 19/1952 |
| 10,749,096 | B2* | 8/2020 | Przybysz | H10N 60/815 |
| 11,108,380 | B2* | 8/2021 | Keane | H03K 19/1952 |
| 2020/0136626 | A1* | 4/2020 | Rylov | H03K 3/38 |
| 2020/0301874 | A1* | 9/2020 | Shainline | G06N 3/067 |
| 2020/0342296 | A1* | 10/2020 | Wynn | G06N 10/00 |
| 2021/0271961 | A1* | 9/2021 | Bozbey | G06N 3/063 |
| 2022/0358353 | A1* | 11/2022 | Bozbey | H03K 19/195 |
| 2023/0274131 | A1* | 8/2023 | Bozbey | G06N 3/065 |
| | | | | 706/33 |
| 2023/0334302 | A1* | 10/2023 | Bozbey | G06N 10/00 |

OTHER PUBLICATIONS

Written Opinion of the International Searching Authority for corresponding PCT/TR2019/050510, dated Mar. 25, 2020.

Schneider et al., "Ultralow power artificial synapses using nanotextured magnetic Josephson junctions", Science Advances 2018, Jan. 26, 2018.

Rippert et al. "A multilayered superconducting neural network implementation", IEEE Transactions on Applied Superconductivity, vol. 7, No. 2, Jun. 1997.

* cited by examiner

NEURON CIRCUIT

FIELD OF THE INVENTION

The present invention relates to a neuron circuit, which electronically applies the working principle of the neurons in human brain, controls an input signal according to a set threshold value, and enables to provide an output signal above the threshold value.

BACKGROUND OF THE INVENTION

Artificial intelligence is the general name given to the work, wherein, upon getting inspired by the behavioral patterns of all of the living creatures in nature, modelling systems that resemble these behaviors are constructed. Artificial intelligence is usually directed at analyzing humans' thinking methods and developing artificial instructions similar to them. In general, artificial intelligence is to enable the behaviors which are identified as intelligent when conducted by humans (intelligent behavior) to be performed by machines, or artificial intelligence is a theory showing how the human mind works. By means of artificial intelligence, it is aimed to make the machines more intelligent and useful. Artificial intelligence provides the machines with a number of functions like thinking, decision making, comparison and analysis such as the ones displayed by humans. Artificial intelligence has many applications such as expert systems, fuzzy logic, artificial neural networks, and genetic algorithms. Artificial neural networks (ANN) are logical software developed to perform, by mimicking the operation mechanism of the human brain, the basic functions of the brain such as learning, remembering and deriving new information by generalization. ANNs are synthetic structures that mimic the biological neural networks. The mimicked nerve cells contain neurons and these neurons connect to each other in various ways to form a network. These networks are capable of learning, storing in memory and revealing the relationship between data. Artificial neural networks are inspired by biological neurons (nerve cells), resulting in artificial simulation of the brain's working system. Artificial neural networks, such as the binding of many biological neurons in the human brain in general terms, are produced for realizing a whole process structure at various levels of activity of many simple and generally adaptive processing units (artificial neurons) which mimic the input, processing, and output characteristics of the biological neuron.

In the current art, artificial neural networks can be evaluated in 3 main categories. The first one is software, the second is semiconductor device based and the last one is superconductor device based. Significant progress has been made in software and semiconductor based artificial neural networks of the first and second categories, particularly in the stages of developing algorithms. But the most important problem of these systems is their slow operation and high-power consumption. Neuron circuits can be designed in terms of software, but because too many algorithms are running, the processes are carried out slowly. The problems with superconductor-based artificial nerve cells are that the circuits do not operate reliably, the single flux quantum (SFQ) is not compatible with the digital circuits, and that they are relatively complex structures having large areas. In the electronic application of artificial neural networks, there are integrated structures on the chip and these structures occupy a large area. In the state of the art, artificial neural network application is performed electronically with semiconductors. When the artificial neural networks application is carried out with semiconductors, the size of the neuron circuits is large and in this case they are unpractical. On the other hand, neuron circuits produced by semiconductors consume too much power. Since the neuron circuits consume too much power, the current transmission also slows down. Therefore, the neuron circuits produced by semiconductors work slowly. In this case, the semiconducting neuron circuits cannot keep up with the brain in terms of the processing power. On the other hand, it is not possible in the state of the art to integrate the neuron circuits to each other and to work with the circuits that enable to produce the input. Furthermore, the neuron circuits provided in the current art cannot operate compatibly with the other logic gates (AND/OR, etc.) and are unable to receive and process the signal generated by the standard gates. When producing the neuron circuits, there is a need for a low-power structure that conducts faster than semiconductors.

In another technique in the state of the art, software is developed for a normally used processor via computer modeling. Calculations are conducted on the program that is written. Software-based artificial neural networks are not efficient due to their slow operation. In the current art, there is a need for a neuron circuit which is capable of conducting the operation of the neurons in the human brain in exactly the same manner or in a similar way, will provide a more rapid transmission with a semiconducting external material, and can be used together with other integrated electronic circuits.

United States patent document no. U.S. Pat. No. 5,625,752A, an application in the state of the art, with a priority date of 17 Jun. 1994, discloses an artificial neuron circuit. In the study discussed in the said document, the differential voltage input is constructed with a structure connectable to equal resistors. Equal resistors are used to define weights of the voltage outputs and conducting links are formed for voltage transitions. The invention of the said document discloses a circuit constructed by using conductive materials and resistors. The neuron circuit disclosed in the invention of the present application comprises two loops wherein one enables to adjust the threshold value and the other enables decaying. The said loops are made of a superconducting material. There are insulating junctions on the loop that enables to adjust the threshold value. In the present invention, there is provided a resistor on the loop which enables to adjust the threshold value. The said resistor contributes to the adjustment of the output time of the signal entering the loop when the threshold value is being adjusted. Additionally, threshold value adjustment can be made by means of the decaying loop.

Chinese patent document no. CN105976022A, an application in the state of the art, with a priority date of 27 Apr. 2016, discloses an artificial neuron circuit. In the study of the said document, two parallel signal lines are used one of which is utilized as reference. The current synapse operation is enabled to be simulated by means of an alterable resistor. The said state of the art document discloses a circuit construction which allows adjustment of resistance. The neuron circuit disclosed in the invention of the present application comprises two loops wherein one enables to adjust the threshold value and the other enables decaying. The said loops are made of a superconducting material. The cited document does not indicate that the circuit is made of a superconducting material. There are insulating junctions on the loop that enables to adjust the threshold value. In the present invention, there is provided a resistor on the loop which enables to adjust the threshold value. The said resistor contributes to the adjustment of the output time of the signal entering the loop when the threshold value is being adjusted. Additionally, threshold value adjustment can be made by means of the decaying loop.

Chinese patent document no. U.S. Pat. No. 5,625,752A, an application in the state of the art, with a priority date of 23.012017, discloses an ultra-band low-noise artificial circuit. The amplifier used in the study of the said document is composed of a variable resistor and n number of sequentially arranged semiconductors. The variable resistor optimizes the operation band range and noise level of the circuit. The invention disclosed in the said document has the features of variable resistor, use of conductive structures and ability to change the operation frequency settings by adjustment of resistance. The neuron circuit disclosed in the invention of the present application comprises two loops wherein one enables to adjust the threshold value and the other enables decaying. The said loops are made of a superconducting material. The cited document does not indicate that the circuit is made of a superconducting material. There are insulating junctions on the loop that enables to adjust the threshold value. In the present invention, there is provided a resistor on the loop which enables to adjust the threshold value. The said resistor contributes to the adjustment of the output time of the signal entering the loop when the threshold value is being adjusted. Additionally, threshold value adjustment can be made by means of the decaying loop.

The neuron circuit of the present invention, inspired by the principle of operation of the neural structure in the brain, is produced in order to achieve results faster than the existing structures. The neuron circuit of the present application is the circuit capable of generating the operating principle of the brain electronically. The said neuron circuits are produced from a superconducting material which provides rapid transmission with low power consumption. As the neuron circuits are made of superconductors, the circuit size decreases. The neuron circuit of the present application can operate compatibly with the standard logic gates (AND/OR) that provide the input. In this case, the said neuron circuits can receive and process the signal produced by the standard logic gates. The neuron circuits can be integrated to each other and arranged successively. The outputs of the neuron circuits of the present invention are also compatible with the standard gates and other neuron circuits.

In the state of the art, there is no explanation regarding the technical features and the technical effects provided by the invention of the present application. The current applications do not disclose a superconducting neuron circuit which, inspired by the operating principle of the neural structure in the brain, is produced to achieve results faster than the existing structures, and which provides a transmission faster than semiconductors, works with low power, and can work compatibly and in integration with the other neuron circuits and standard logic gates.

OBJECTS OF THE INVENTION

An object of the present invention is to provide an artificial neuron circuit which simulates the neuron structure in the brain and is able to produce the operating principle of the brain electronically.

Another object of the present invention is to provide a neuron circuit which reduces the area used by the large-scale integrated circuits on the chip and which is capable of utilizing the calculation speed and power parallel to the neurons in the brain nervous system.

A further object of the present invention is to provide a neuron circuit, which enables the transmission to be faster than that of the neuron structure in the brain and enables to adjust the threshold value and to modify and control the threshold values.

Another object of the present invention to provide a neuron circuit which works in compliance with the standard logic gates that produce an input, and which enables the output signal to work in compliance with the standard logic gates.

A further object of the present invention is to provide a neuron circuit which, thanks to the fact that it is made of a superconducting material, provides rapid transmission with low power consumption.

SUMMARY OF THE INVENTION

A neuron circuit, which is developed to fulfill the objects of the present invention and defined in claim 1 and the other claims dependent thereon is comprised of a decaying loop and a decaying threshold coupling. The threshold loop and the decaying loop provided in the neuron circuit are superconducting. The signal is input to the threshold loop through the signal input. The threshold resistor is used when the signal entering into the threshold loop is preferred to be completely decayed. The current passing through the threshold resistor decays. The first junction and the second junction are used when the signal entering into the threshold loop is preferred to be stored. Signals coming from the signal input at regular intervals are stored in the threshold loop by the first junction and the second junction. If the signal stored in the threshold loop reaches the threshold value, it is output through the signal output. The time of the output signal is adjusted by the decaying loop. The decaying loop and the threshold loop are coupled to each other by means of magnetic interaction and via the decaying threshold coupling. By changing the coupling factor of the decaying loop with the threshold loop, the time of the output signal and the threshold value can be adjusted.

DETAILED DESCRIPTION OF THE INVENTION

Figure 2:
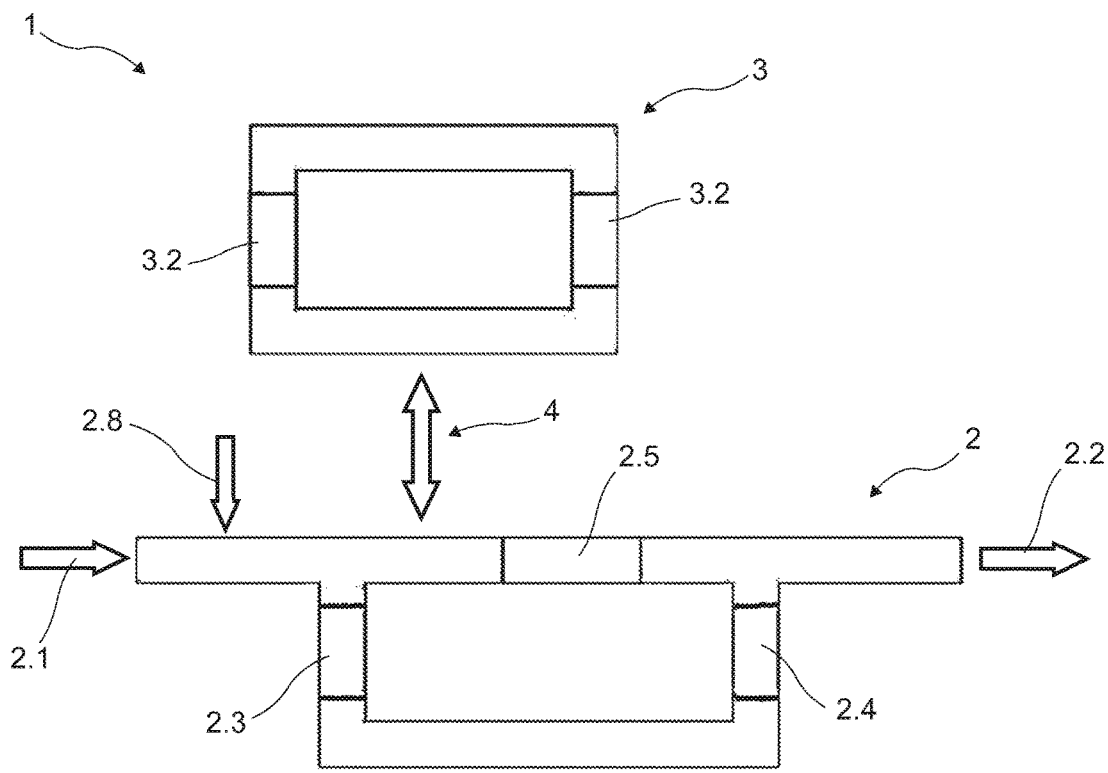

The neuron circuit developed to fulfill the objects of the present invention is illustrated in the accompanying figures, in which:

FIG. 1 is a schematic view of the neuron circuit.
FIG. 2 is a diagram view of the neuron circuit.
The components in the figures are given reference numbers as follows:
1. Neuron circuit
2. Threshold loop
   2.1. Signal input
   2.2. Signal output
   2.3. First junction
   2.4. Second junction
   2.5. Threshold resistor
   2.6. Threshold side inductor
   2.7. Threshold side coupled inductor
   2.8. Bias input
3. Decaying loop
   3.1. Decaying side coupled inductor
   3.2. Decaying resistor
4. Decaying threshold coupling A superconducting neuron circuit (1), which controls an input signal according to a set threshold value and enables to output an output signal above the threshold value, essentially comprises at least one threshold loop (2); which has at least one signal input (2.1), at least one signal output (2.2), at least one first junction (2.3), at least one second junction (2.4), and at least one threshold side coupled inductor (2.7); and which is superconducting, receives the input signal to be processed from the signal input (2.1), decays the said signal according to the threshold value or enables the output of the signal through the signal output (2.2), and repeats the same process for each new signal;

at least one first junction (2.3) and at least one second junction (2.4) which are insulating and which enable the signal to remain within the threshold loop (2) between the signal input (2.1) and the signal output (2.2) until it reaches the threshold value;

at least one decaying loop (3), which has at least one decaying side coupling inductor (3.1), and which is superconducting and upon being integrated with the threshold loop (2), enables to determine the threshold value of the signal in the threshold loop (2);

at least one decaying side coupled inductor (3.1), which is coupled to the threshold side coupled inductor (2.7) provided on the threshold loop (2) via the decaying threshold coupling (4), and which enables to determine the threshold value of the signal in the threshold loop (2) with the effect of the factor of coupling between itself and the threshold side coupled inductor (2.7) and the magnetic fields they create.

The neuron circuit (1) of the present application is capable of generating the operating principle of the brain electronically and simulating operation of the neural network structure. The neuron circuit (1) is superconducting and is comprised of a threshold loop (2) and a decaying loop (3). The threshold loop (2) and the decaying loop (3) are coupled to each other magnetically. The magnetic coupling between the threshold loop (2) and the decaying loop (3) is provided by means of the decaying threshold coupling (4). The signal incoming to the neuron circuit (1) is processed or decayed by the threshold loop (2). The threshold value of the signal processed in the threshold loop (2) is adjusted and it can be decayed by the decaying loop (3). The neuron circuit (1) controls an input signal according to a set threshold value by mimicking the neural structure in the brain and enables to emit an output signal above the threshold value. The neuron circuit (1) can be operated in integration with other neuron circuits (1). At the same time, the neuron circuit (1) of the present invention works in accordance with the standard logic gates and receives signal input from and delivers signal output to the standard logic gates.

The threshold loop (2) in the neuron circuit (1) of one embodiment of the invention enables to store or decay the incoming signal. The signals circulating on the threshold loop (2) work like the ions in the brain. The threshold loop (2) comprises a signal input (2.1), a signal output (2.2), a first junction (2.3), a second junction (2.4), threshold resistor (2.5), a threshold side inductor (2.6), a threshold side coupled inductor (2.7) and a bias input (2.8). The threshold loop (2) is superconducting. The threshold loop (2) receives the signal to be processed from the signal input (2.1). The threshold loop (2) decays the said signal relative to the threshold value or supplies the output of the signal through the signal output (2.2). The threshold loop (2) repeats the same process for each new signal. Signal is input to the threshold loop (2) via the signal input (2.1). The signal input (2.1) can be connected to the circuit component that produces the signal preferred to enter into the threshold loop (2). The signal input (2.1) enables the signal to enter into the threshold loop (2). The signal entering into the threshold loop (2) through the signal input (2.1) is stored and also decayed in the threshold loop (2). When the signal is preferred to be stored in the threshold loop (2), the signal is output from the threshold loop (2) through the signal output (2.2).

The first junction (2.3) and the second junction (2.4) provided in the threshold loop (2) of one embodiment of the invention are insulator. The first junction (2.3) and the second junction (2.4) enable the signal to remain within the threshold loop (2) between the signal input (2.1) and the signal output (2.2) until it reaches the threshold value. The first junction (2.3) and the second junction (2.4) are located in the threshold loop (2) preferably opposite and parallel to each other (FIG. 2). The first junction (2.3) and the second junction (2.4) are located in the threshold loop (2) between the signal input (2.1) and the signal output (2.2). The first junction (2.3) and the second junction (2.4) are within the loop that forms a signal loop in the threshold loop (2). There is a loop in the threshold loop (2) in order for the signal to remain between the signal input (2.1) and the signal output (2.2). The first junction (2.3) and the second junction (2.4) are located in the said loop.

When the signal incoming to the threshold loop (2) through the signal input (2.1) exceeds the threshold value, the first junction (2.3) and the second junction (2.4) enable the signal to be transformed into an output signal and they determine the amplitude of the signal in the threshold loop (2) and the number of signals incoming to the threshold loop (2). When the signal incoming to the threshold loop (2) through the signal input (2.1) exceeds the threshold value when it reaches the first junction (2.3) and the second junction (2.4), the signal is output through the signal output (2.2) whereby it is transformed into an output signal. In this embodiment of the invention, when there is no threshold resistor (2.5) and threshold side inductor (2.6) on the threshold loop (2), the first junction (2.3) and the second junction (2.4) continue processing the signal in an endless loop until it reaches the preferred threshold value. If the signal incoming to the threshold loop (2) is lower than the preferred threshold value, it enters into the loop in the threshold loop (2) and passes over the first junction (2.3) and the second junction (2.4). If the signal incoming to the threshold loop (2) is higher than the preferred threshold value, it is output from the threshold loop (2). The signal incoming to the threshold loop (2) starts to circulate (moves in a loop). When the signal is circulating within the threshold loop (2), a part of it is decayed by the first junction (2.3) and the second junction (2.4). When the same signal continues to circulate within the threshold loop (2), signals continue to successively come to through the signal input (2.1). This way, the signals are stored in the threshold loop (2). If the signals exceed the preferred threshold value, they are output through the signal output (2.2) as output signal. The number and threshold value of the signal incoming to the threshold loop (2) can be determined by means of the first junction (2.3) and the second junction (2.4). Additionally, the first junction (2.3) and the second junction (2.4) enable to adjust the number of signals required to exceed the threshold value.

In one embodiment of the invention, the threshold resistor (2.5) provided in the threshold loop (2) enables to decay or attenuate the signal. The threshold resistor (2.5) carries out current limiting by providing a resistance against the current acting thereon. In this case, the threshold resistor (2.5) limits the signal in the threshold loop (2), thereby enabling to decay it or attenuate energy of the signal. The threshold resistor (2.5) is used when the signal entering into the threshold loop (2) is preferred to be completely decayed. The threshold resistor (2.5) enables the signal in the threshold loop (2) to behave according to the preferred threshold value. The preferred threshold value of the threshold loop (2) is adjusted by the threshold resistor (2.5). The threshold value is increased or decreased by increasing or decreasing the value of the threshold resistor (2.5). By means of the threshold value, it is determined on which threshold value the signal incoming to the threshold loop (2) will be output, in other words, after which threshold value an output signal will be generated at the signal output (2.2). Signal decaying should be carried out for the threshold value adjustment of the threshold loop (2). Additionally, the threshold resistor (2.5) also enables to adjust the storage times of the signal(s) that will be stored in the threshold loop (2). When the input signal enters the threshold loop (2), it is stored in the threshold loop (2). The threshold resistor (2.5) decreases storage of the signal stored in the threshold loop (2) preferably gradually. The threshold resistor (2.5) enables to store the signal in the threshold loop (2) such that it is decayed in time. When the threshold resistor (2.5) decays the signal and continues to store it, the first junction (2.3) and the second junction (2.4) ensure that the signal remains in the threshold loop (2) until it reaches the threshold value.

In one embodiment of the invention, the threshold side inductor (2.6) provided in the threshold loop (2) provides the signal transmission on the superconducting threshold loop (2). The threshold side inductor (2.6), similar to the threshold resistor (2.5), enables to adjust the decaying time and storage time of the signal on the threshold loop (2). The threshold side inductor (2.6) is operated so as to store current therein. The threshold side inductor (2.6), similar to the threshold resistor (2.5), also enable to adjust the storage times of the signal(s) that will be stored in the threshold loop (2). While signal transmission is carried out by means of the threshold side inductor (2.6), the signal is decayed and continued to be stored by means of the threshold resistor (2.5). The first junction (2.3) and the second junction (2.4) enable the signal to circulate in a loop during decaying and storage thereof until it reaches the threshold value in the threshold loop (2). The threshold value is determined by means of the decaying loop (3).

In one embodiment of the invention, the threshold side coupled inductor (2.7) provided in the threshold loop (2) provides the coupling between the threshold loop (2) and the decaying loop (3). The threshold loop (2) and the decaying loop (3) are coupled to each other magnetically. The magnetic coupling of the threshold loop (2) to the decaying loop (3) is provided by means of the threshold side coupled inductor (2.7).

In one embodiment of the invention, the bias input (2.8) provided in the threshold loop (2) enables continuous supply. The bias input (2.8) provides the energy required for operation of the threshold loop (2). The bias input (2.8) supplies the threshold loop (2) with direct current (DC). The first junction (2.3) and the second junction (2.4) provided in the threshold loop (2) are powered by direct current supply. In this case, upon activating the bias input (2.8), direct current is supplied to the threshold loop (2) to enable operation of the first junction (2.3) and the second junction (2.4). The bias input (2.8) also ensures that the threshold value remains at the desired level. The bias input (2.8) preferably works under a transistor-like current. In this embodiment of the present invention, when a signal arrives on the threshold loop (2), the bias input (2.8) enables the first and second junctions in the loop to be operated by being opened and closed.

The decaying loop (3) in the neuron circuit (1) of one embodiment of the present invention is magnetically coupled to the threshold loop (2). The decaying loop (3) adjusts the level of timing of the output time of the signal input to the threshold loop (2). The decaying loop (3) can adjust the output time and timing of the signal input in accordance with the coupling factor between itself and the threshold loop (2). The decaying loop (3) comprises a decaying side coupled inductor (3.1) and a decaying resistor (3.2). The decaying loop (3) is superconducting. The decaying loop (3) is integrated to the threshold loop (2) to enable determining the threshold value of the signal in the threshold loop (2). The decaying loop (3) enables the signal in the threshold loop (2) to be decayed or the threshold value to be adjusted. The decaying loop (3) carries out the process of decaying the signal in the threshold loop (2). One or more decaying resistors (3.2) may be provided on the decaying loop (3). The decaying resistor (3.2) enables the signal decaying. The decaying resistor (3.2) provided in the decaying loop (3) carries out the process of decaying by enabling to decay the signal in the threshold loop (2) to which it is magnetically coupled. Upon adjustment of the coupling factor between the decaying loop (3) and the threshold loop (2) at a sufficient level, current is generated on the decaying loop (3) due to the magnetic field. The current generated on the decaying loop (3) decreases as it passes over the decaying resistor (3.2). As the current in the decaying loop (3) decreases, the magnetic field decreases as well and the current is converted to heat. The decaying resistor (3.2) provided in the decaying loop (3) carries out the threshold value adjustment of the signal in the threshold loop (2). As the decaying resistor (3.2) increases, the threshold value of the signal in the threshold loop (2) increases. In this case, if the decaying resistor (3.2) increases, the threshold value increases as well since more signals are needed.

The decaying side coupled inductor (3.1) provided in the decaying loop (3) in one embodiment of the invention is connected to the threshold side coupled inductor located (2.7) on the threshold loop (2) via the decaying threshold coupling (4). The decaying side coupled inductor (3.1) and threshold side coupled inductor (2.7) enable to determine the threshold value of the signal in the threshold loop (2) by the effect of the coupling factor between themselves and the magnetic fields they generate.

In one embodiment of the invention, the decaying threshold coupling (4) provided in the neuron circuit (1) provides the connection between the threshold loop (2) and the decaying loop (3). The threshold loop (2) and the decaying loop (3) are coupled to each other magnetically. The magnetic coupling between the threshold loop (2) and the decaying loop (3) is provided by means of the decaying threshold coupling (4). The threshold side coupled inductor (2.7) in the threshold loop (2) and the decaying side coupled inductor (3.1) in the decaying loop (3) are arranged such that they will be affected by each other's magnetic field. In this case, when the threshold loop (2) is in fixed position, the position of the decaying loop (3) can be adjusted such that the magnetic field generated by the decaying side coupled inductor (3.1) is affected by the magnetic field generated by the threshold side coupled inductor (2.7). The magnetic field generated by the decaying side coupled inductor (3.1) and the magnetic field generated by the threshold side coupled inductor (2.7) can trigger each other. The coupling factor between the threshold loop (2) and the decaying loop (3) is changed depending on the magnetic field generated by the decaying side coupled inductor (3.1) and the magnetic field generated by the threshold side coupled inductor (2.7). The threshold value of the signal in the threshold loop (2) can be adjusted by changing the coupling factor between the decaying loop (3) and the threshold loop (2).

In one embodiment of the invention, when the coupling factor between the decaying loop (3) and the threshold loop (2) is decreased, the threshold value of the signal in the threshold loop (2) is decreased. When the coupling factor between the decaying loop (3) and the threshold loop (2) is increased, the decaying side coupled inductor (3.1) is maximum affected by the magnetic field of the threshold side coupled inductor (2.7). When the decaying side coupled inductor (3.1) is maximum affected by the magnetic field of the threshold side coupled inductor (2.7), decaying of the signal current stored in the threshold loop (2) increases. Upon reaching the threshold value with the new incoming signals during the decaying, the signal is output through the signal output (2.2).

In one embodiment of the invention, when the coupling factor between the decaying loop (3) and the threshold loop (2) is increased, the threshold value of the signal in the threshold loop (2) is increased. When the coupling factor between the decaying loop (3) and the threshold loop (2) is decreased, the decaying side coupled inductor (3.1) is minimally affected from the magnetic field of the threshold coupling inductor (2.7). When the decaying side coupled inductor (3.1) is minimally affected by the magnetic field of the threshold side coupled inductor (2.7), decaying of the signal current stored in the threshold loop (2) slows down, and when it reaches the threshold value by means of the new incoming signal(s), it is output through the signal output (2.2).

Use of the neuron circuit (1) provided in this embodiment of the invention is performed as follows: The threshold loop (2) and the decaying loop (3) provided in the neuron circuit (1) are superconducting. The signal is input to the threshold loop (2) through the signal input (2.1). The threshold resistor (2.5) is used when the signal entering into the threshold loop (2) is preferred to be completely decayed. The current passing through the threshold resistor (2.5) is decayed. The first junction (2.3) and the second junction (4) are used when the signal entering into the threshold loop (2) is preferred to be stored. The signals coming from the signal input (2.1) at regular intervals are stored in the threshold loop (2) by the first junction (2.3) and the second junction (2.4). If the signal stored in the threshold loop (2) reaches the threshold value, it is output through the signal output (2.2). The time of the output signal is adjusted by the decaying loop (3). The decaying loop (3) and the threshold loop (2) are coupled to each other by means of magnetic interaction via the decaying threshold coupling (4). By changing the coupling factor of the decaying loop (3) with the threshold loop (2), the time of the output signal and the threshold value can be adjusted.

The invention claimed is:

1. A neuron circuit, which is superconducting, and which controls an input signal according to a set threshold value and enables to output an output signal above the threshold value, the neuron circuit comprising:
at least one threshold loop, which has at least one signal input, at least one signal output, at least one first junction, at least one second junction, and at least one threshold side coupled inductor; and which is superconducting, receives the input signal to be processed from the signal input, decays the said signal according to the threshold value or enables the output of the signal through the signal output, and repeats the same process for each new signal;
at least one first junction and at least one second junction which are insulator and which enable the signal to remain within the threshold loop between the signal input and the signal output until it reaches the threshold value;
at least one decaying loop, which has at least one decaying side coupling inductor, and which is superconducting and upon being integrated with the threshold loop, enables determination of the threshold value of the signal in the threshold loop;
at least one decaying side coupled inductor, which is coupled to the threshold side coupled inductor provided on the threshold loop via the decaying threshold coupling, and which enables determination of the threshold value of the signal in the threshold loop with the effect of the distance between itself and the threshold side coupled inductor and the magnetic fields they create.

2. Neuron circuit according to claim 1, wherein the threshold loop, which comprises a threshold resistor, a threshold side inductor, and a bias input, receives the signal to be processed from the signal input, and enables storing of the signal entering through the signal input.

3. Neuron circuit according to claim 2, wherein the threshold resistor (2.5), which limits and thereby decays the signal in the threshold loop (2), enables current limiting by providing a resistance against the current acting thereon, and enables the signal to reach the preferred threshold value.

4. Neuron circuit according to claim 2, wherein the threshold resistor, which enables adjustment of the decay times of the signal(s) that will be stored in the threshold loop, and which reduces the signal in the threshold loop thereby enabling storage of the signal when it is being decayed in time.

5. Neuron circuit according to claim 2, wherein the threshold side inductor, which is operated so as to store current therein, and provides the signal transmission on the threshold loop, and, similar to the threshold resistor, enables adjustment of the decaying time of the signal in the threshold loop, the decay time of the signal(s) that will be stored therein, and the time of keeping the signal(s) in the circuit.

6. Neuron circuit according to claim 2, wherein the bias input, which supplies the threshold loop with direct current (DC), and which provides continuous supply and the power required for energizing the threshold loop, and ensures that the signal remains at the threshold value.

7. Neuron circuit according to claim 1, wherein the signal input which is connected to the circuit component that produces the signal preferred to enter into the threshold loop and enables the signal to enter into the threshold loop.

8. Neuron circuit according to claim 1, wherein the first junction and the second junction, which, when the signal entering into the threshold loop through the signal input exceeds the threshold value, enable the signal to be transformed into an output signal, and determine the amplitude of the signal in the threshold loop and the number of signals incoming to the threshold loop.

9. Neuron circuit according to claim 1, wherein the first junction and the second junction which, when there is no threshold resistor and threshold side inductor on the threshold loop, enable the signal incoming through the signal input to be stored in a persistent loop until it reaches the preferred threshold value.

10. Neuron circuit according to claim 1, wherein the decaying loop which has a decaying resistor, is magnetically coupled to the threshold loop, adjusts the output time and storage duration of the signal input in accordance with the coupling factor between itself and the threshold loop, and is integrated to the threshold loop to enable determination of the threshold value of the signal in the threshold loop.

11. Neuron circuit according to claim 1, wherein the decaying loop which, upon increasing of the coupling factor between itself and the threshold loop, current is generated thereon due to the magnetic field, and enables the current generated thereon to decrease as it passes over the decaying resistor.

12. Neuron circuit according to claim 1, wherein the decaying loop comprising the decaying resistor, which enables to adjust the threshold value of the signal in the threshold loop, and which, when increased, enables to increase the required number of signals, i.e. the threshold value of the signal in the threshold loop.

13. Neuron circuit according to claim 1, wherein the decaying side coupled inductor which is arranged such that itself and the threshold side coupled inductor in the threshold loop will be affected by each other's magnetic fields, and which, together with the threshold side coupled inductor, trigger each other's magnetic fields.

14. Neuron circuit according to claim 1, wherein the decaying loop, which, when the coupling factor between itself and the threshold loop is reduced, enables to reduce the threshold value of the threshold loop and enables the decaying side inductor to be minimally affected by the magnetic field of the threshold side inductor.

15. Neuron circuit according to claim 1, wherein the decaying loop, which, when the decaying side coupled inductor is minimally affected by the magnetic field of the threshold side coupled inductor, slows down the decaying of the signal current stored in the threshold loop.

16. Neuron circuit according to claim 1, wherein the decaying loop, which, when the coupling factor between itself and the threshold loop is increased, enables to increase the threshold value of the threshold loop and enables the decaying side inductor to be maximally affected by the magnetic field of the threshold side inductor.

17. Neuron circuit according to claim 1, wherein the decaying loop, which, when the decaying side coupled inductor is maximally affected by the magnetic field of the threshold side coupled inductor, accelerates the decaying of the signal current stored in the threshold loop.

* * * * *